(12) United States Patent
Cai et al.

(10) Patent No.: US 9,853,067 B2
(45) Date of Patent: Dec. 26, 2017

(54) THIN FILM TRANSISTOR ARRAY SUBSTRATE

(71) Applicant: Shanghai Tianma Micro-Electronics Co., Ltd., Shanghai (CN)

(72) Inventors: Tao Cai, Shanghai (CN); Bengang Zhao, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 14/137,861

(22) Filed: Dec. 20, 2013

(65) Prior Publication Data

US 2014/0175445 A1    Jun. 26, 2014

(30) Foreign Application Priority Data

Dec. 24, 2012 (CN) .......................... 2012 1 0567631

(51) Int. Cl.
   *H01L 27/12* (2006.01)
   *G02F 1/1362* (2006.01)
   *H01L 29/786* (2006.01)

(52) U.S. Cl.
   CPC .... *H01L 27/1255* (2013.01); *G02F 1/136209* (2013.01); *G02F 1/136213* (2013.01); *H01L 29/78633* (2013.01); *G02F 2201/40* (2013.01)

(58) Field of Classification Search
   CPC ............. H01L 27/3272; H01L 27/1255; H01L 33/0041; H01L 29/78633; H01L 27/3244; H01L 27/12; G02F 1/134363; G02F 1/136209; G02F 1/136213; G02F 1/13338

USPC .......... 257/40, 70, 71, 662; 438/22; 349/44, 349/113, 141; 313/504
See application file for complete search history.

(56) References Cited

U.S. PATENT DOCUMENTS

| | | | |
|---|---|---|---|
| 2003/0193284 A1* | 10/2003 | Park | H01L 27/3244 313/504 |
| 2004/0135236 A1* | 7/2004 | Hirano | H01L 27/12 257/662 |
| 2006/0003504 A1 | 1/2006 | Paik | |
| 2006/0146212 A1 | 7/2006 | Ahn et al. | |
| 2006/0146255 A1 | 7/2006 | Ahn | |
| 2006/0214564 A1 | 9/2006 | Chang | |

(Continued)

OTHER PUBLICATIONS

Extended European Search Report as issued by the European Patent Office, dated Apr. 7, 2015.

*Primary Examiner* — Matthew Reames
*Assistant Examiner* — Young W Kim
(74) *Attorney, Agent, or Firm* — Alston & Bird LLP

(57) ABSTRACT

A thin film transistor array substrate includes a substrate, a plurality of pixel elements arranged on the substrate, each of the pixel elements including a thin film transistor and a pixel electrode electrically connected with the thin film transistor, a light shielding electrode disposed between the substrate and the thin film transistor to shield a channel of the thin film transistor, and a storage capacitor including a first electrode and a second electrode disposed opposite to each other. The light shielding electrode includes a transparent electrically-conductive layer and a non-transparent electrically-conductive layer stacked on top of each other. The first electrode of the storage capacitor is disposed in a same layer and of a same material as the transparent electrically-conductive layer of the light shielding electrode.

10 Claims, 11 Drawing Sheets

(56) References Cited

U.S. PATENT DOCUMENTS

| | | | |
|---|---|---|---|
| 2008/0158461 A1* | 7/2008 | Kenmochi | G02F 1/13338 349/46 |
| 2011/0147757 A1* | 6/2011 | Kim | H01L 29/78633 257/71 |
| 2012/0069257 A1 | 3/2012 | Oh et al. | |
| 2012/0097940 A1 | 4/2012 | Kwon et al. | |
| 2013/0270527 A1* | 10/2013 | Kwon | H01L 33/0041 257/40 |

* cited by examiner

US 9,853,067 B2

THIN FILM TRANSISTOR ARRAY SUBSTRATE

CROSS-REFERENCES TO RELATED APPLICATIONS

This application claims the benefit of priority to Chinese Patent Application No. 201210567631.2, filed with the Chinese Patent Office on Dec. 24, 2012 and entitled "THIN FILM TRANSISTOR ARRAY SUBSTRATE", the contents of which is incorporated herein by reference in its entirety.

FIELD OF THE INVENTION

The present invention relates to the field of liquid crystal display technologies, and in particular to a thin film transistor array substrate with an improved storage capacitor design.

BACKGROUND OF THE INVENTION

Among existing flat display technologies, a Liquid Crystal Display (hereinafter "LCD") can be considered as one of the most mature technologies, for example, a mobile phone, all of a digital camera, a video camera, a notebook computer, a monitor, etc., as common in daily life are products manufactured with this technology. Among the LCD technologies, a Thin Film Transistor Liquid Crystal Display (hereinafter "TFT LCD") is predominant at present in the LCD market due its characteristics of low power consumption and a relatively low fabrication cost as well as a superior transmittivity and aperture ratio.

As illustrated in FIG. 1 and FIG. 2, a Thin Film Transistor (hereinafter "TFT") array substrate in the prior art includes a substrate 101, and a plurality of gate lines 102 and a plurality of data lines 103 arranged on the substrate 101, and the plurality of gate lines 102 intersect with the plurality of data lines 103 so that adjacent gate lines and data lines define a pixel unit, and each pixel unit includes a Thin Film Transistor (simply TFT below) 104 and a pixel electrode 105 electrically connected with a drain/source of the TFT, and the TFT is arranged at the intersection of a gate line 102 with a data line 103. Each TFT 104 includes a gate 106, an active layer 107, the source 108 and the drain 109. A first insulation layer 118 is arranged between the active layer 107 and the substrate 101, a second insulation layer 110 is arranged between the active layer 107 and the gate 106, a third insulation layer 111 is arranged between the gate 106, and the source 108 and the drain 109, the source 108 and the drain 109 are formed on the third insulation layer 111 respectively through a via 114 and a via 115, and a passivation layer 112 and a planarization layer 113 are arranged on the source 108 and the drain 109. Finally the pixel electrode 105 is deposited. The gate 106 is formed integral to the gate line 102, the source 108 and the drain 109 are formed with the data line 103 simultaneously, and the drain 109 and the pixel electrode 105 are typically connected through a passivation layer via 118. When a turn-on signal is applied to the gate line 102, the active layer 107 is electrically conductive, and a data signal of the data line 103 can reach the drain 109 from the source 108 through a channel of the active layer 107 and is then provided to the pixel electrode 105. The pixel electrode 105 receiving the signal forms with a common electrode (where the common electrode can be arranged on the array substrate or a color film substrate not illustrated dependent upon the type of display panel) an electric field causing liquid crystals to rotate.

A storage capacitor includes an electrode 116 in the same layer as the gate 106, an electrode 117 in the same layer as the drain 109, and the third insulation layer 111 disposed between electrodes 116 and 117, and the storage capacitor is formed between the electrode 116 and the electrode 117.

The storage capacitor is a primary means to maintain the pixel electrode at a potential at the end of a scan signal of a TFT LCD pixel, and the storage capacitor of the pixel can be added uniformly to improve the uniformity of a picture effectively. However the storage capacitor of the pixel has to be added with the consequence that the aperture ratio is smaller in the prior art.

BRIEF SUMMARY OF THE INVENTION

The invention provides a thin film transistor array substrate including: a substrate, a plurality of pixel elements arranged on the substrate, each of the pixel elements including a thin film transistor and a pixel electrode electrically connected with a drain/source of the thin film transistor, a light shielding electrode disposed between the substrate and the thin film transistor and configured to shield a channel of the thin film transistor, and a storage capacitor including a first electrode and a second electrode disposed opposite to each other. The first electrode of the storage capacitor is disposed in the same layer as the light shielding electrode.

The invention provides a display panel including the thin film transistor array substrate according to the invention.

DETAILED DESCRIPTION OF THE INVENTION

In order to make the foregoing objects, features and advantages of the invention more apparent, embodiments of the present invention will be detailed in conjunction with the drawings as follows.

First Embodiment

Figure 1:
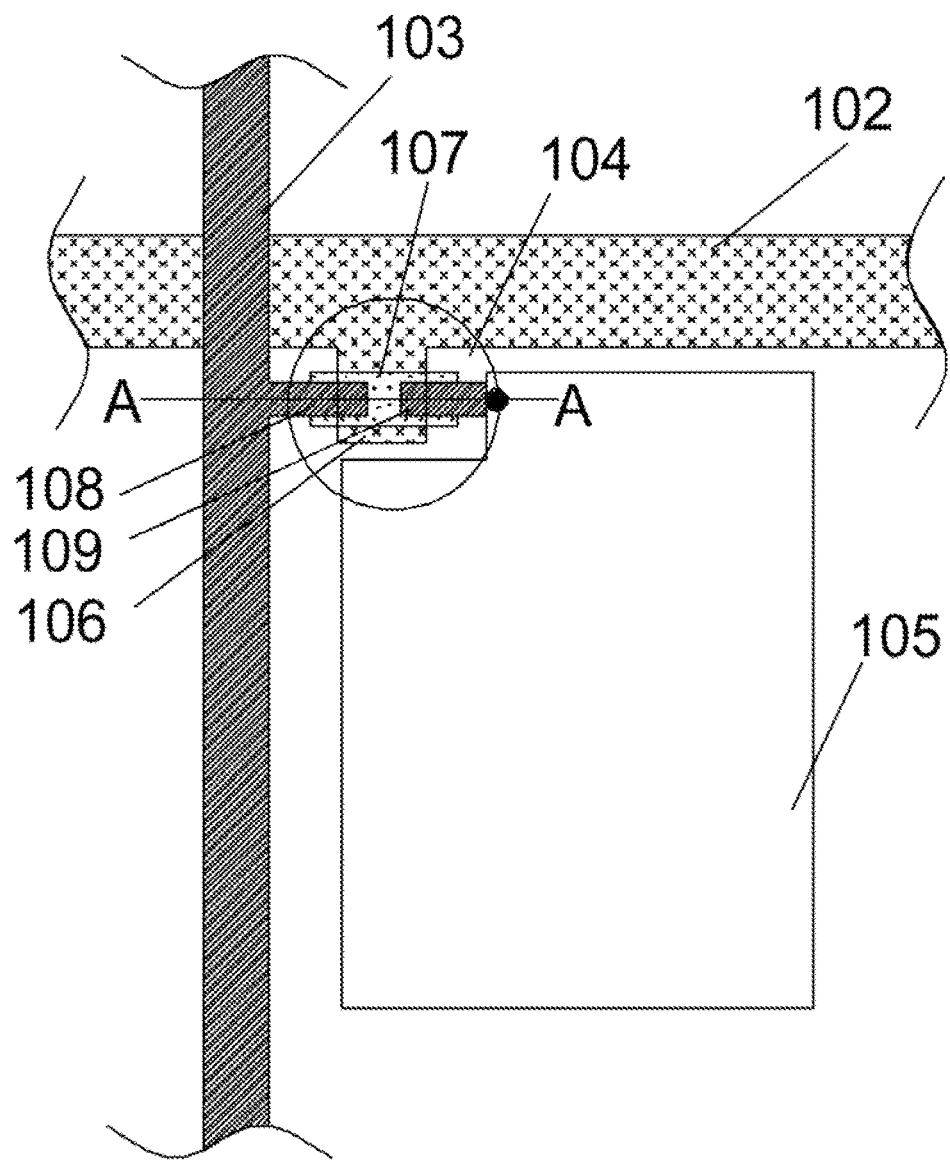
FIG. 1 is a structural top view of a thin film transistor array substrate in the prior art.
Figure 2:
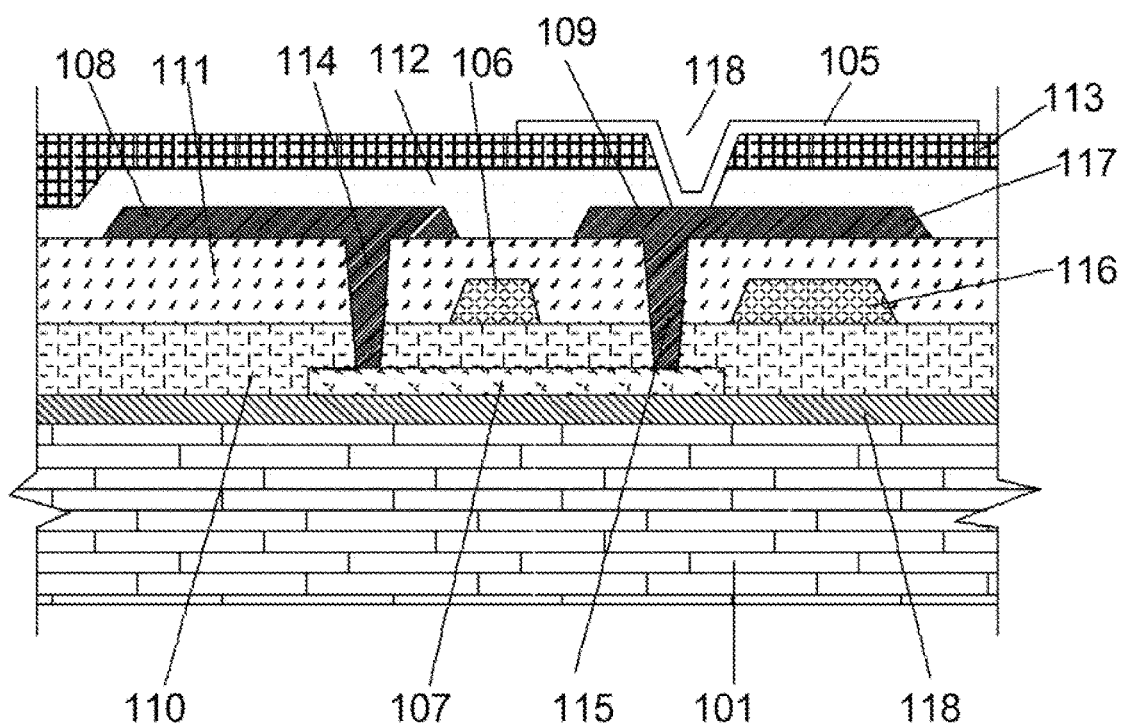
FIG. 2 is a schematic sectional view of FIG. 1 along A-A.
Figure 3:
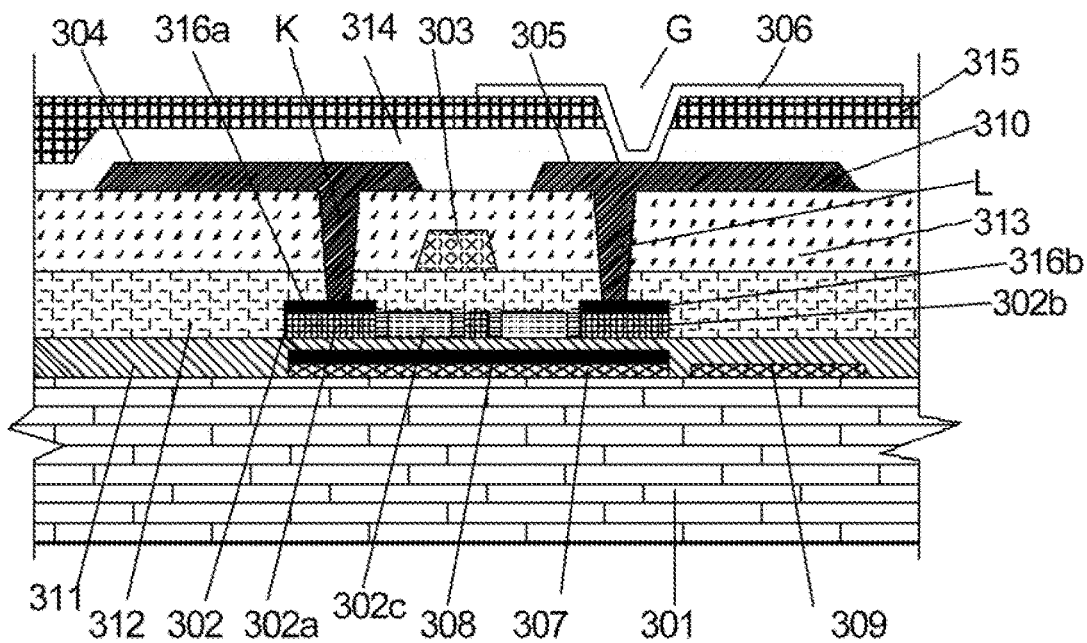
FIG. 3 is a schematic structural diagram of a thin film transistor array substrate according to a first embodiment of the present invention.

FIG. 3 is a schematic structural diagram of a thin film transistor array substrate according to a first embodiment of the present invention. As illustrated in FIG. 3, 301 is a substrate, 302 is an active layer, 303 is a gate, 304 is a source electrode, 305 is a drain electrode, 306 is a pixel electrode, 307 is a transparent electrically-conductive layer of a light shielding electrode, 308 is a non-transparent electrically-conductive layer of the light shielding electrode, 309 is a first electrode of a storage capacitor, 310 is a second electrode of the storage capacitor, 311 is a first insulation layer, 312 is a second insulation layer, 313 is a third insulation layer, 314 is a passivation layer, 315 is a planarization layer.

In a preferred embodiment, the substrate 301 is a transparent substrate, particularly of a material which can be glass, a transparent organic material, and the like.

The transparent electrically-conductive layer 307 of the light shielding electrode, the non-transparent electrically-conductive layer 308 of the light shielding electrode and the first electrode 309 of the storage capacitor are formed on the substrate 301, and the transparent electrically-conductive layer 307 of the light shielding electrode and the non-transparent electrically-conductive layer 308 of the light shielding electrode are stacked on top of each other. The material of the transparent electrically-conductive layer 307 of the light shielding electrode is preferably of tin indium oxide. In a preferred embodiment, the first electrode 309 of the storage capacitor and the transparent electrically-conductive layer 307 of the light shielding electrode are formed at the same time and of the same material. The first electrode 309 of the storage capacitor and the transparent electrically-conductive layer 307 of the light shielding electrode are disconnected from each other.

It shall be noted that the light shielding electrode may not necessarily be the dual-layer stack structure illustrated in FIG. 3 but can be of a stack structure of more than two layers, and the first electrode 309 of the storage capacitor and any layer or combination of more than one layer in the multi-layer structure of the light shielding electrode are formed at the same time and typically of the same material. However generally speaking, the first electrode 309 of the storage capacitor and the light shielding electrode are located in the same layer and typically of the same material. The respective layers included in the light shielding electrode can be stacked in an order designed dependent upon a practical demand.

In another embodiment of the invention, the first electrode 309 of the storage capacitor may not be formed at the same time and of the same material as the transparent electrically-conductive layer 307 of the light shielding electrode, but the first electrode 309 of the storage capacitor can alternatively be of a non-transparent electrically-conductive material. The material of the non-transparent electrically-conductive layer of the light shielding electrode can include at least one of molybdenum (Mo), chromium (Cr), aluminum (Al), Silver (Ag), titanium (Ti), tantalum (Ta) and tungsten (W).

The first insulation layer 311 is formed between the active layer 302 and a light shielding layer, and the first insulation layer 311 can be formed through chemical vapor deposition or physical vapor deposition as a single layer of silicon oxide or silicon nitride or more than layer of at least one of silicon oxide and silicon nitride.

The active layer 302 is formed above the substrate including the transparent electrically-conductive layer 307 of the light shielding electrode and the non-transparent electrically-conductive layer 308 of the light shielding electrode, and the active layer 302 and the light shielding electrode are insulated from each other. The active layer 302 can be formed by crystallizing an amorphous silicon layer formed on the first insulation layer 311 into a poly-silicon layer and then patterning the poly-silicon layer. The active layer includes a source region 302a, a drain region 302b and a channel 302c, and the channel 302c and the non-transparent electrically-conductive layer 308 of the light shielding electrode are stacked on top of each other, that is, the width of the non-transparent electrically-conductive layer 308 of the light shielding electrode is larger than or equal to the width of the channel 302c, and the channel is shielded by the non-transparent electrically-conductive layer 308 of the light shielding electrode.

The second insulation layer 312 is located between the active layer 302 and the gate 303, and the second insulation layer 312 can include at least one insulation material of tetraethyl orthosilicate, silicon oxide or silicon nitride.

The gate 303 is located on the second insulation layer 312 and insulated from the second insulation layer 312. The gate 303 can include at least one of molybdenum (Mo), chromium (Cr), aluminum (Al), Silver (Ag), titanium (Ti), tantalum (Ta) and tungsten (W).

The third insulation layer 313 is formed on the substrate including the gate 303, and the insulation layer 313 can include at least one insulation material of tetraethyl orthosilicate, silicon oxide or silicon nitride.

The source electrode 304 and the drain electrode 305 are formed on the third insulation layer 313 and insulated from the gate 303.

The source electrode 304 and the source region 302a are electrically connected through a via K, and the drain electrode 305 and the drain region 302b are electrically connected through a via L. The source electrode 304 and the drain electrode 305 can include at least one of molybdenum (Mo), chromium (Cr), aluminum (Al), Silver (Ag), titanium (Ti), tantalum (Ta) and tungsten (W). Preferably an etching stopper 316a can be further included between the source region 302a and the source electrode 304, and an etching stopper 316b can be further included between the drain region 302b and the drain electrode 305. The etching stoppers 316a and 316b can include at least one of molybdenum (Mo), chromium (Cr), aluminum (Al), Silver (Ag), titanium (Ti), tantalum (Ta) and tungsten (W).

The passivation layer 314 is formed on the substrate including the source electrode 304 and the drain electrode 305, and the passivation layer can include at least one insulation material of silicon oxide or silicon nitride.

The planarization layer 315 is formed above the passivation layer 314. In another embodiment of the invention, the planarization layer 315 can be omitted.

Finally the pixel electrode 306 is formed above the planarization layer 315, and the pixel electrode 306 is a transparent electrically-conductive layer and can be of tin indium oxide. The pixel electrode 306 and the drain electrode 305 are electrically connected through a via G.

The thin film transistor array substrate of the first embodiment further includes the second electrode 310 of the storage capacitor, and the second electrode 310 of the storage capacitor is located (disposed) in the same layer and of the same material as the source electrode 304 and the drain electrode 305. In a preferred embodiment, the second electrode 310 of the storage capacitor and the drain electrode 305 are electrically connected. Thus, it is ensured that the second electrode 310 of the storage capacitor is at the same potential as that of the pixel electrode 306. The scope of the invention will not be limited thereto, and in another embodiment of the invention, the second electrode of the storage capacitor may not be electrically connected with the drain electrode, but the second electrode of the storage capacitor can alternatively be electrically connected with the pixel electrode as long as the second electrode 310 of the storage capacitor is at the same potential as that of the pixel electrode 306.

Figure 4:
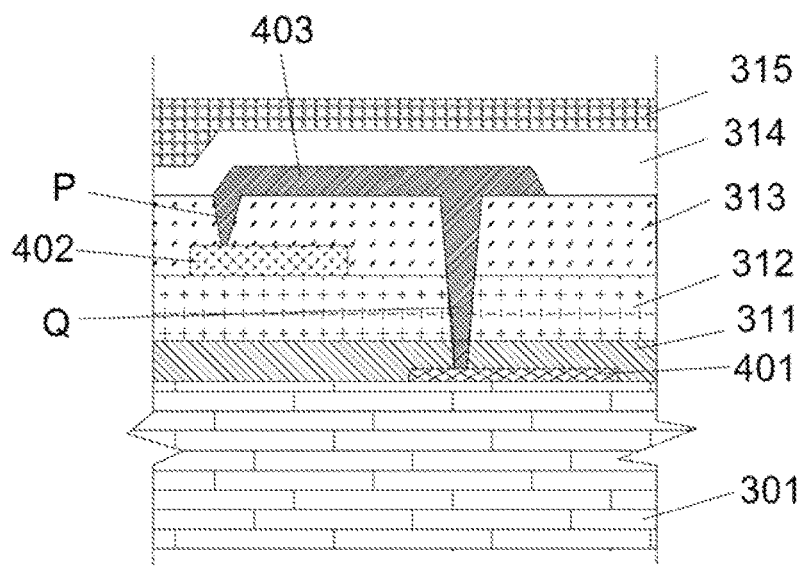
FIG. 4 is a schematic structural diagram of a peripheral drive circuit according to the first embodiment of the present invention.

In an embodiment of the invention, a peripheral drive circuit is further included to provide the first electrode 310 of the storage capacitor with a potential, The thin film transistor array substrate includes a display area and a peripheral area surrounding the display area, the thin film transistor and the storage capacitor are located in the display area, and the peripheral drive circuit is located in the peripheral areas. As illustrated in FIG. 4, the peripheral drive circuit includes the substrate 301, a peripheral transparent electrically-conductive layer 401, the first insulation layer 311, the second insulation layer 312, a first connection metal 402 connected with a common electrode, the third insulation layer 313, a second connection metal 403, the passivation layer 314 and the planarization layer 315.

A structure of the peripheral drive circuit will be detailed below in conjunction with FIG. 3 and FIG. 4, where the peripheral transparent electrically-conductive layer 401 and the transparent electrically-conductive layer 307 of the light shielding electrode are formed at the same time and of the same material, the peripheral transparent electrically-conductive layer 401 and the first electrode 309 of the storage capacitor are electrically connected, and the peripheral transparent electrically-conductive layer 401 and the transparent electrically conductive layer of the light shielding electrode are disconnected from each other. Thus, the first electrode 309 of the storage capacitor is at the same potential as that of the peripheral transparent electrically conductive layer, and the potential of the first electrode 309 of the storage capacitor will not interfere with that of the transparent electrically-conductive layer of the light shielding electrode.

The first connection metal 402 and the gate 303 are formed at the same time and of the same material, and the first connection metal 402 and the common electrode (not illustrated) are connected.

The second connection metal 403 is formed at the same time and of the same material as the source electrode metal 304 and the drain electrode metal 305, the second connection metal 403 and the first connection metal 402 are electrically connected through a via P, and the second connection metal 403 and the peripheral transparent electrically-conductive layer 401 are electrically connected through a via Q. The via P and the via Q are formed through etching at the same time as the via K and the via L, and the via Q can be formed by firstly dry etching to the second insulation layer 312 and then wet etching to the peripheral transparent electrically-conductive layer 401, or the via Q can alternatively be formed by controlling the concentration and the speed of etching gas for dry etching.

Apparently the peripheral transparent electrically-conductive layer 401 is at the same potential as that of the first connection metal 402, and since the first connection metal 403 and the common electrode are connected, the first electrode 309 of the storage capacitor is at the same potential as the common electrode when the potential of the first electrode 309 of the storage capacitor is provided by the peripheral drive circuit. This is merely a preferred embodiment of the invention, and in another embodiment of the invention, the first electrode of the storage capacitor can alternatively be electrically connected otherwise with the common electrode, for example, the first electrode of the storage capacitor is connected with the peripheral transparent electrically-conductive layer which is electrically connected directly with the first connection metal through a via, or the first electrode of the storage capacitor and the common electrode are electrically connected directly, all of which will not depart from the scope of the invention.

In this embodiment, the storage capacitor is formed between the first electrode 309 and the second electrode 310, and the second electrode 310 and the drain electrode 305 are located in the same layer and of the same material. Moreover, there is also a storage capacitor formed between the first electrode 309 and the pixel electrode 306.

Thus in this embodiment, the first electrode of the storage capacitor and the light shielding electrode are located in the same layer so that the storage capacitor of the thin film transistor array substrate can be added to make full use of the existing space.

Second Embodiment

Figure 5:
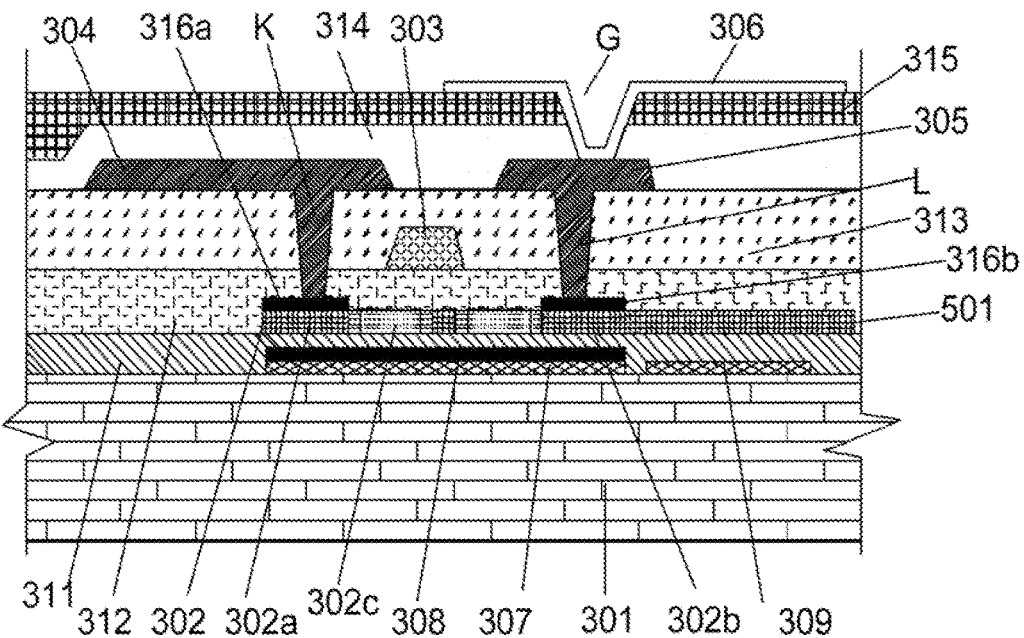
FIG. 5 is a schematic diagram of a second electrode of a storage capacitor being in the same layer as an active layer according to a second embodiment of the present invention.

As illustrated in FIG. 5, the second embodiment is different from the first embodiment in that a second electrode 501 of the storage capacitor and the active layer 302 are formed at the same time, located in the same layer and of the same material. Preferably the second electrode 501 of the storage capacitor and the drain region 302b are electrically connected. Since the drain region 302b and the drain electrode 305 are electrically connected, and the drain electrode 305 and the pixel electrode 306 are electrically connected, the second electrode 501 of the storage capacitor is at the same potential as that of the pixel electrode 306.

Similarly, this embodiment of the invention uses the transparent electrode in the same layer as the light shielding electrode as the first electrode of the storage capacitor to thereby make full use of the existing space and add the storage capacitor without lowering an aperture ratio.

Third Embodiment

Figure 6:
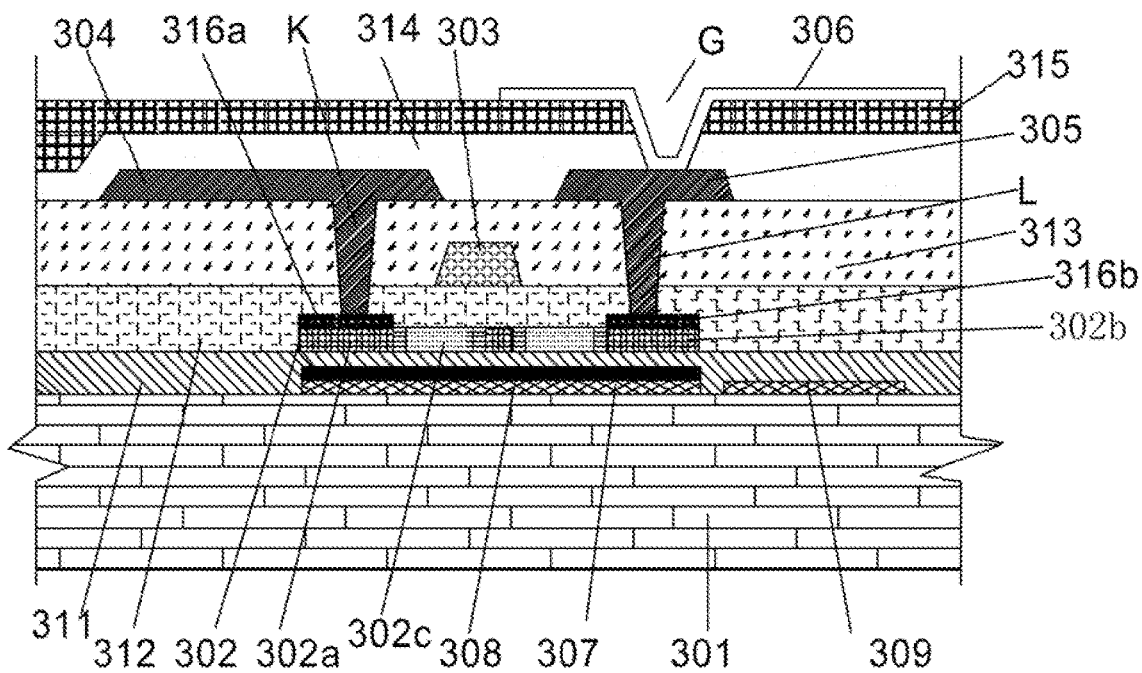
FIG. 6 is a schematic diagram of a second electrode of a storage capacitor being a pixel electrode according to a third embodiment of the present invention.

As illustrated in FIG. 6, the third electrode is different from the first electrode in that the second electrode of the storage capacitor is the pixel electrode 306. The storage capacitor is formed between the first electrode 309 of the storage capacitor and the pixel electrode 306.

In the third embodiment of the invention, the storage capacitor is generally formed between the first electrode, in the same layer as the light shielding electrode, of the storage capacitor and the second electrode of the storage capacitor, but the scope of the invention will not be limited thereto. For example, the storage capacitor can include a first electrode, a second electrode, a third electrode and a fourth electrode, where the first electrode is in the same layer as the light shielding electrode, the second electrode is in the same layer as the active layer, the third electrode is in the same layer as the drain electrode, and the fourth electrode is in the same layer as the pixel electrode, so that the storage capacitor can be formed between the first electrode and the second electrode, between the first electrode and the third electrode, and between the first electrode and the fourth electrode. Alike the storage capacitor can be added without lowering the aperture ratio.

Fourth Embodiment

Figure 7:
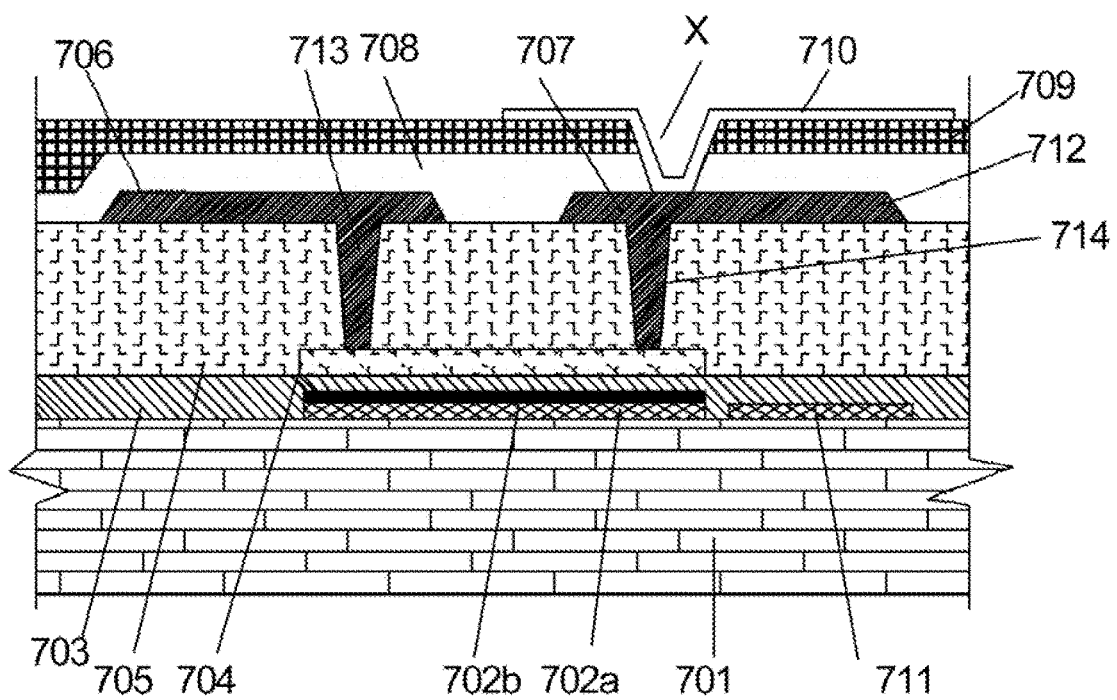
FIG. 7 is a schematic structural diagram of a bottom gate-type thin film transistor array substrate according to a fourth embodiment of the present invention.

As illustrated in FIG. 7, the fourth embodiment provides another thin film transistor array substrate which is of a bottom gate-type structure including:

A substrate 701 including a transparent insulation material;

A light shielding electrode formed on the substrate 701, where the light shielding electrode includes a transparent electrically-conductive layer 702a and a non-transparent electrically-conductive layer 702b, and the non-transparent electrically-conductive layer 702b of the light shielding electrode is a gate of the thin film transistor array substrate;

A first insulation layer 703 formed on the non-transparent electrically-conductive layer 702b;

An active layer 704 formed on the first insulation layer 703, where the active layer can be a poly-silicon layer;

A second insulation layer 705 formed on the active layer 704;

An source electrode 706 and a drain electrode 707 formed on the second insulation layer 705, where the source electrode 706 and the active layer 704 are electrically connected through a via 713, and the drain electrode 707 and the active layer 704 are electrically connected through a via 71;

A passivation layer 708 formed on the substrate including the source electrode 706 and the drain electrode 707;

A planarization layer 709 formed on the passivation layer 708;

A pixel electrode 710 formed on the planarization layer 709, where the drain electrode 707 and the pixel electrode 710 are electrically connected through a via X;

A first electrode 711 of a storage capacitor, where the first electrode 711 of the storage capacitor and the transparent electrically-conductive layer 702a of the light shielding electrode are formed at the same time, located in the same layer and of the same material, and the first electrode 711 of the storage capacitor and the transparent electrically-conductive layer 702a of the light shielding electrode are disconnected from each other. However, the scope of the invention will not be limited thereto, but in another embodiment of the invention, the first electrode 711 of the storage capacitor may not be formed at the same time and of the same material as the transparent electrically-conductive layer 702a of the light shielding electrode, and instead the first electrode 711 of the storage capacitor can alternatively be of a non-transparent electrically-conductive material.

A second electrode 712 of the storage capacitor, where the second electrode 712 of the storage capacitor and the drain electrode 707 can be formed at the same time, located in the same layer and of the same material. Preferably the second electrode 712 of the storage capacitor and the drain electrode 707 are electrically connected. However the scope of the invention will not be limited thereto, and in another embodiment of the invention, the second electrode 712 of the storage capacitor may not be formed at the same time and of the same material as the drain electrode 707, and instead the second electrode 712 of the storage capacitor and the pixel electrode 710 can be electrically connected. In another embodiment of the invention, the second electrode 712 of the storage capacitor can be a pixel electrode.

A potential of the first electrode 711 of the storage capacitor is provided by a peripheral drive circuit which is structurally identical to the peripheral drive circuit in the first embodiment of the invention, and a repeated description of which will be omitted herein.

The invention further provides a display panel including the thin film transistor array substrate according to the embodiment of the invention. The liquid crystal can be a liquid crystal display panel, an LED display panel, an OLED display panel, and the like.

Fifth Embodiment

The fifth embodiment provides a method of manufacturing a thin film transistor array substrate. The method of manufacturing a thin film transistor array substrate according to this embodiment will be described in detail below in conjunction with FIG. 8 to FIG. 19.

Figure 8:
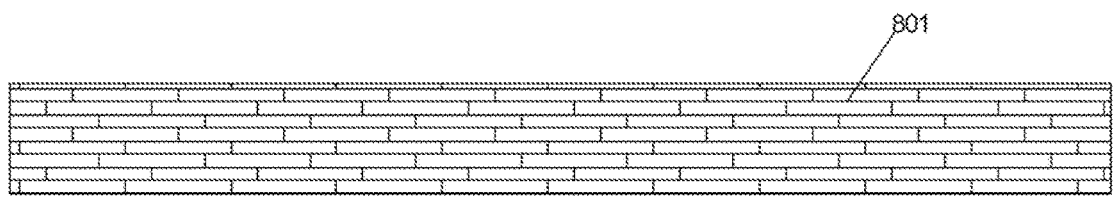
FIG. 8 to FIG. 19 are schematic diagrams of a method of manufacturing a thin film transistor array substrate according to a fifth embodiment of the present invention.
Figure 9:
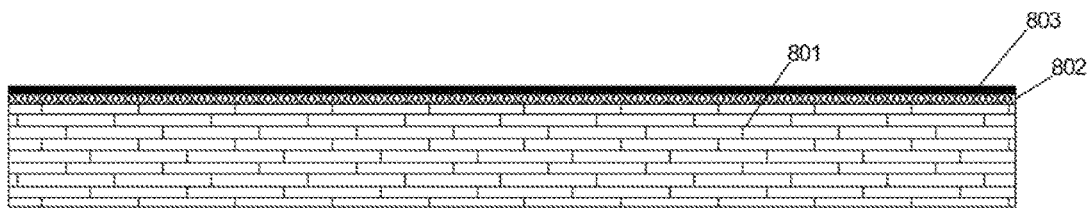
Figure 10:
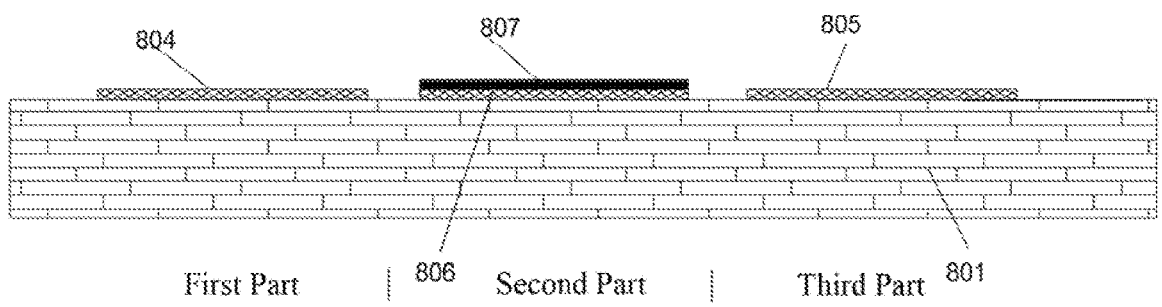
Figure 11:
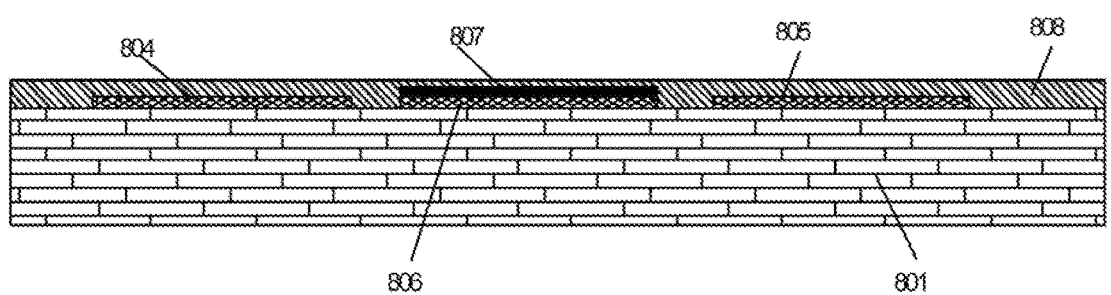

Firstly a substrate 801 is provided (FIG. 8). Substrate 801 may be a transparent substrate, and in particularly made of a material, which can be glass, a transparent organ material, and the like. A transparent electrically-conductive layer 802 and a non-transparent electrically-conductive layer 803 are sputtered on the substrate 801 (FIG. 9), where the material of the transparent electrically-conductive layer 802 can be tin indium oxide, and the material of the non-transparent electrically-conductive layer 803 can be at least one of molybdenum (Mo), chromium (Cr), aluminum (Al), Silver (Ag), titanium (Ti), tantalum (Ta) and tungsten (W). The non-transparent electrically-conductive layer 803 and the transparent electrically-conductive layer 802 are stacked on top of each other, and photo-resist is coated on the non-transparent electrically-conductive layer 803 and exposed using a mask with a specific pattern. The non-transparent electrically-conductive layer 803 and the transparent electrically-conductive layer 802 are dry-etched into three parts including a first part, a second part and a third part, where the first part is located in a peripheral area of the substrate, and the second part and the third part are located in a display area of the substrate, Particularly the first part and the second part are electrically disconnected, the third part and the second part are electrically disconnected, and the first part and the third part are electrically connected (the connection portion is not illustrated). The photo-resist of the first part and the second part are stripped. The non-transparent electrically-conductive layer of the first part and the second part is removed through dry etching so that a peripheral transparent electrically-conductive layer 804 and a first electrode 805 of a storage capacitor are formed in the first part. The photo-resist of the second part is stripped to thereby form a transparent electrically-conductive layer 806 of a light shielding layer and a non-transparent electrically-conductive layer 807 of the light shielding layer (FIG. 10).

Figure 12:
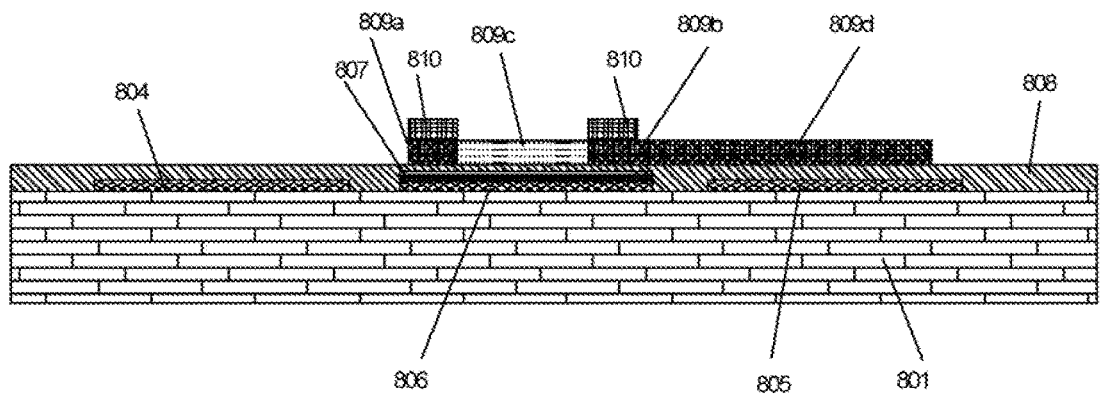
Figure 13:
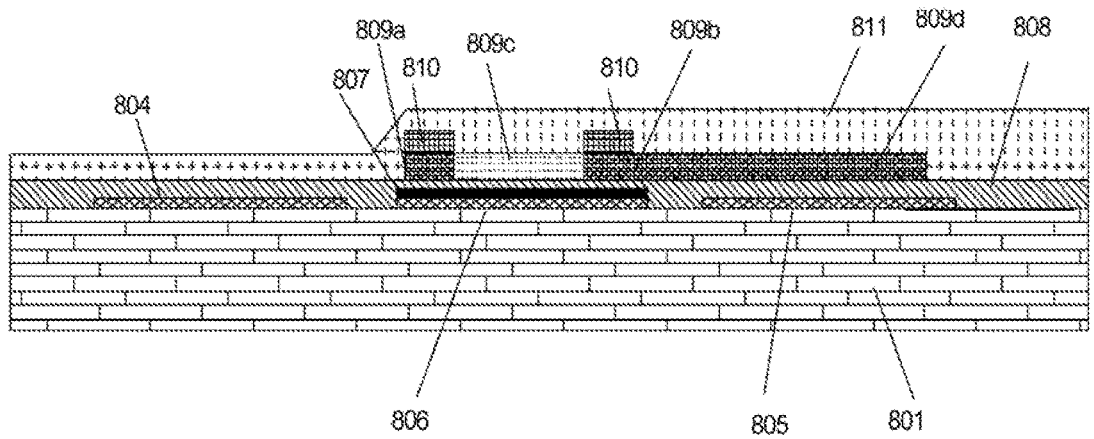
Figure 14:
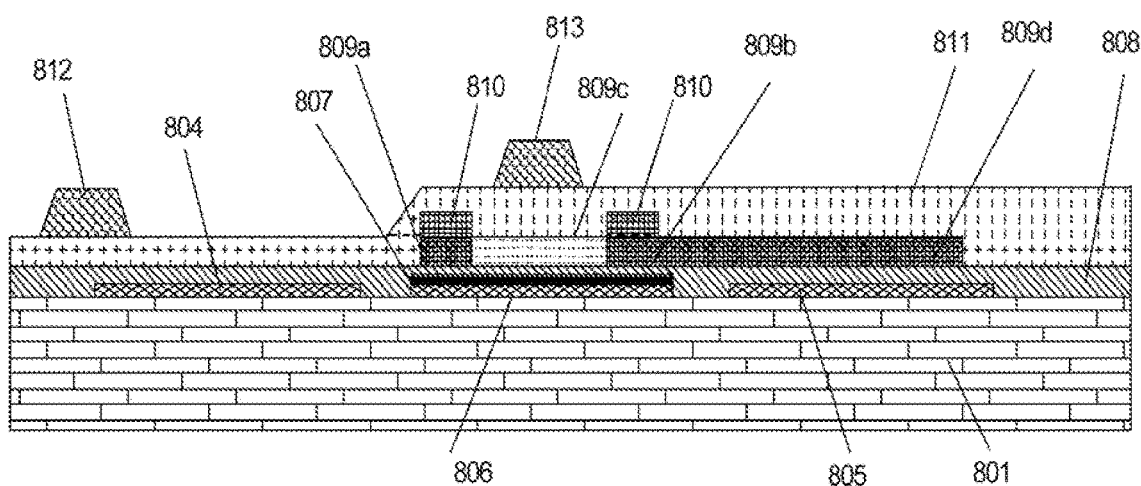
Figure 15:
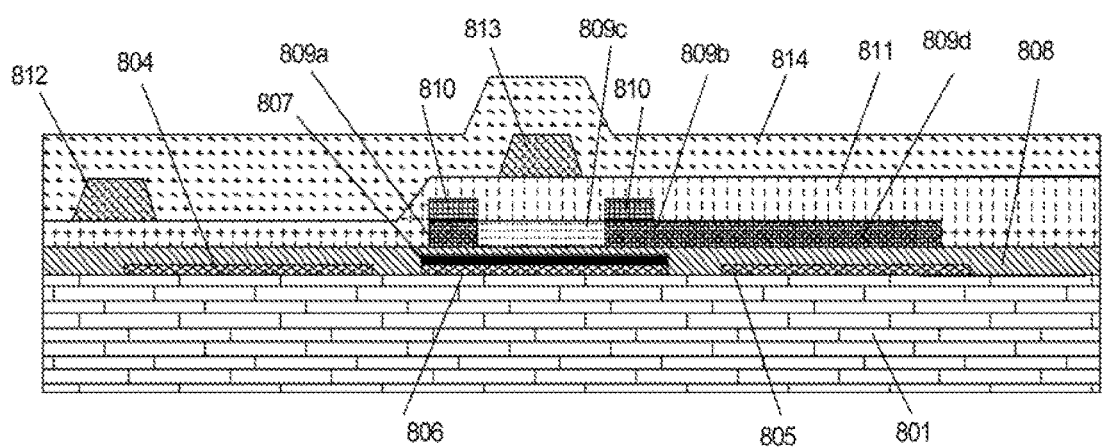

Next a first insulation layer 808 is formed through chemical vapor deposition or physical vapor deposition (FIG. 11), the material of the first insulation layer 808 can be a material with a high selectivity to poly-silicon and can be a single layer of silicon oxide or silicon nitride or more than one layer of at least one of silicon oxide and silicon nitride. Then an amorphous silicon layer is deposited on the first insulation layer 808 and converted into a poly-silicon layer through laser induced crystallization (ELA). In a preferred embodiment, an etching stopper 810 is deposited on the poly-silicon layer and then exposed and etched using a mask with a specific pattern. Then photo-resist outside of a source region and a drain region is stripped. Then the etching stopper 810 outside of the source region 809a and the drain region 809b is removed through dry etching. The remaining photo-resist is stripped to form a second electrode 809d of the storage capacitor (FIG. 12). The second electrode 809d of the storage capacitor and the drain region 809b are located in the same layer and of the same material. Preferably the second electrode 809d of the storage capacitor and the drain region 809b are connected. Then an N-TFT and a P-TFT are channel-doped to form a channel region 809c. A second insulation layer 811 is deposited, which can include at least one insulation material of tetraethyl orthosilicate, silicon oxide or silicon nitride (FIG. 13). Photo-resist is coated on the second insulation layer 811 and exposed and developed, and then on the substrate the photo-resist is etched and stripped to form a first connection metal 812 and a gate 813 (FIG. 14). A third insulation layer 814 is deposited (FIG. 15), which can include at least one insulation material of tetraethyl orthosilicate, silicon oxide or silicon nitride.

Figure 16:
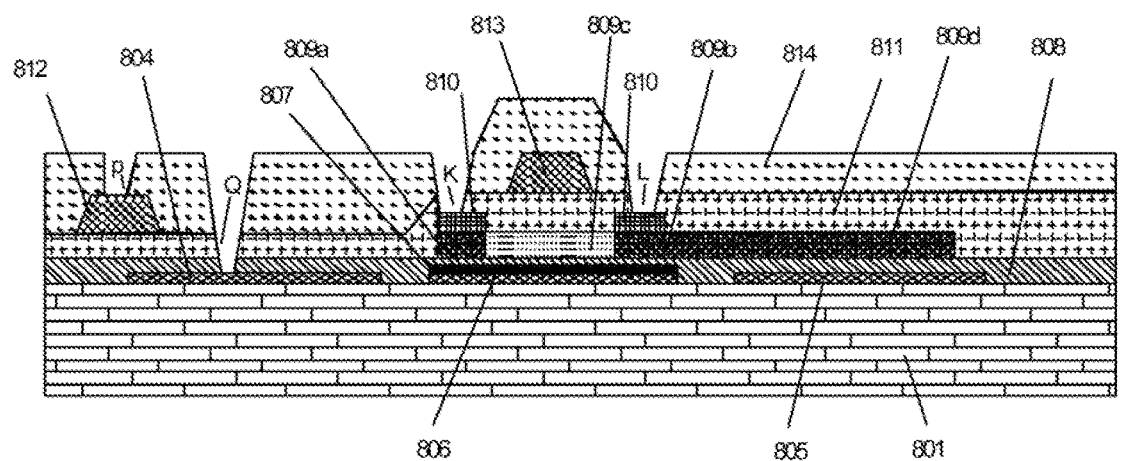
Figure 17:
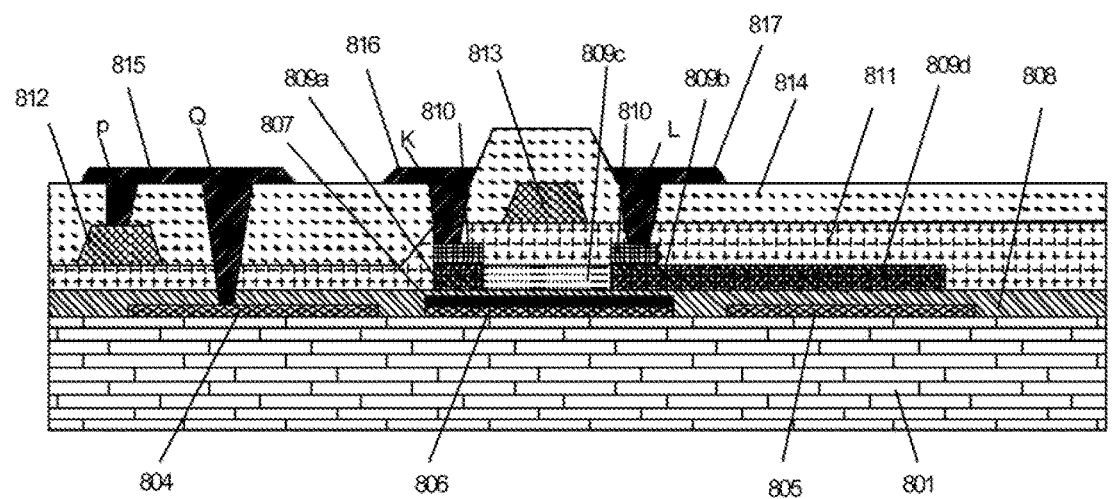
Figure 18:
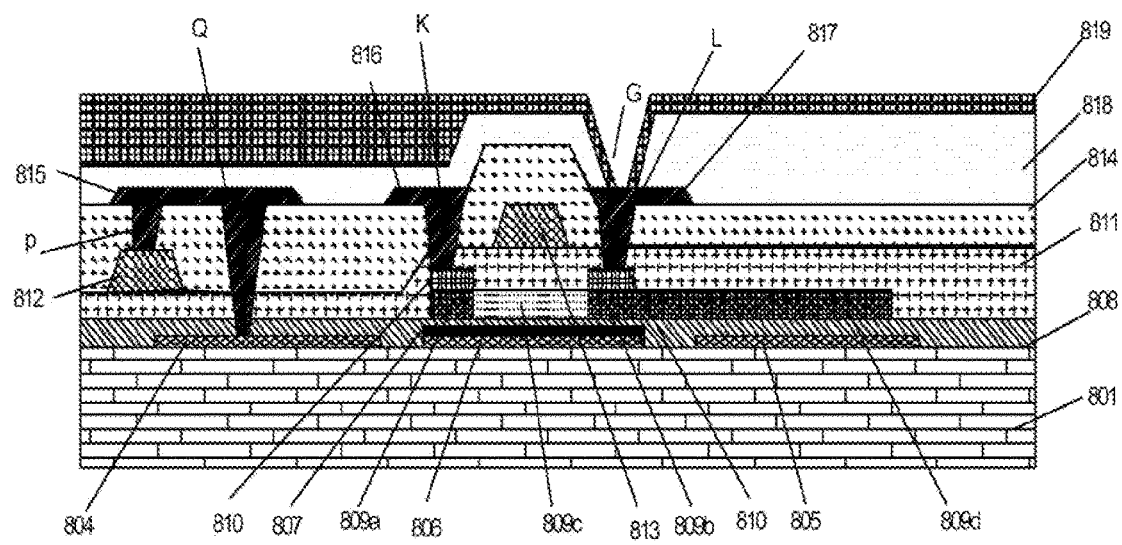

Thereafter, vias P, Q, K and L are formed through dry etching and wet etching, where the via P and the first connection metal 812 are connected, the via Q and the peripheral transparent electrically-conductive layer 804 are connected, the via K and the etching stopper in the source region 809*a* are connected, and the via L and the etching stopper in the drain region 809*b* are connected (FIG. 16). The via Q can be formed by dry etching to the second insulation layer 811 and then wet etching to the peripheral transparent electrically-conductive layer 804. Then on the substrate the photo-resist is exposed, developed, etched and stripped to form a second connection metal 815, a source electrode 816 and a drain electrode 817 (FIG. 17). The materials of the second connection metal 815, the source electrode 816 and the drain electrode 817 can be at least one of molybdenum (Mo), chromium (Cr), aluminum (Al), Silver (Ag), titanium (Ti), tantalum (Ta) and tungsten (W). A passivation layer 818 is deposited and a planarization layer 819 is coated (FIG. 18), and they are dry-etched to form a via G electrically connected with the drain electrode 817. In a preferred embodiment, an electrode can be further formed in this step to be located in the same layer and of the same material as the source electrode 816 and the drain electrode 817 and to overlap with the first electrode 805 of the storage capacitor and can act as a second electrode of the storage capacitor. In correspondence therewith, the second electrode 809*d*, of the storage capacitor, in the same layer and of the same material as the active layer in the foregoing step can be prepared or can be omitted.

Figure 19:
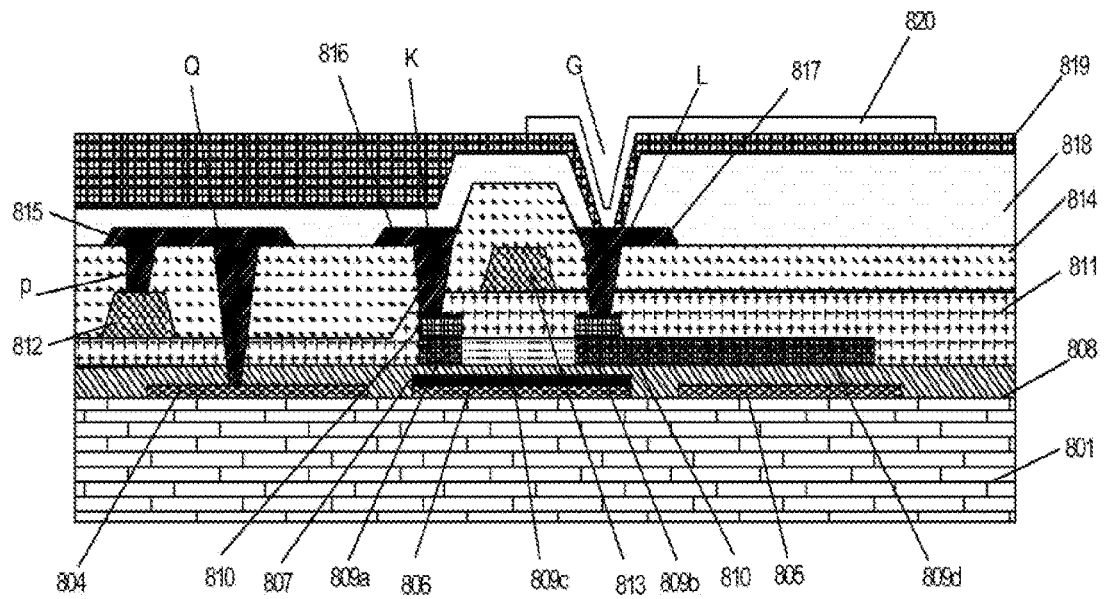

Finally a pixel electrode 820 is deposited, where the material of the pixel electrode 820 can be tin indium oxide, and the pixel electrode 820 and the drain electrode 817 are electrically connected through a via G (FIG. 19). In a preferred embodiment, an electrode can be further formed in this step to be located in the same layer and of the same material as the pixel electrode 820 and to overlap with the first electrode 805 of the storage capacitor and can act as a second electrode of the storage capacitor. In correspondence therewith, the second electrode 809*d*, of the storage capacitor, in the same layer and of the same material as the active layer and/or the second electrode, of the storage capacitor, located in the same layer and of the same material as the source electrode and the drain electrode of a thin film transistor in the foregoing step can be prepared or can be omitted.

In this embodiment, the storage capacitor is formed between the first electrode and the second electrode. Moreover, there is also a storage capacitor formed between the first electrode and the pixel electrode. In this embodiment, the second electrode of the storage capacitor is located in the same layer and of the same material as the active layer. In other embodiments of the invention, the second electrode of the storage capacitor can alternatively be located in the same layer as the drain electrode, and preferably the second electrode of the storage capacitor can be of the same material as the drain electrode.

In summary, with the thin film transistor array substrate according to the invention for which the design of the storage capacitor is improved, the storage capacitor can be added without lowering an aperture ratio to thereby improve the uniformity of a picture and other performances of the display panel effectively.

The foregoing description is merely illustrative of preferred embodiments of the invention but not intended to limit the invention in any form. Although the invention has been disclosed as above in the preferred embodiments, they are not intended to limit the invention. Those skilled in the art can make numerous possible variations and adaptations to the technical solution of the invention or modify the preferred embodiments to equivalent embodiments with equivalent variations in light of the method and technical disclosure above without departing from the scope of the technical solution of the invention. Accordingly, any apparent modifications, equivalent variations and adaptations made to the foregoing embodiments in light of the technical spirit of the invention without departing from the disclosure of the technical solution of the invention shall be encompassed in the claimed scope of the technical solution of the invention.

What is claimed is:

1. A thin film transistor array substrate, comprising:
a substrate;
a plurality of pixel elements arranged on the substrate, each of the pixel elements comprising a thin film transistor and a pixel electrode electrically connected with a drain/source of the thin film transistor;
a light shielding electrode disposed between the substrate and the thin film transistor and configured to shield a channel of the thin film transistor; wherein the light shielding electrode comprises a transparent electrically-conductive layer and a non-transparent electrically-conductive layer stacked on top of each other;
a storage capacitor comprising a first electrode and a second electrode disposed opposite to each other, the [A&B1] first electrode of the storage capacitor being located in a same layer as the transparent electrically-conductive layer of the light shielding electrode, wherein the first electrode of the storage capacitor is formed of transparent electrically-conductive material;
a common electrode;
wherein a potential of the first electrode is the same as a potential of the common electrode; and
a peripheral drive circuit, comprising a peripheral transparent electrically-conductive layer, a first connection metal, a second connection metal,
wherein the first connection metal and the common electrode are electrically connected and have the same potential,
wherein the second connection metal and the first connection metal are electrically connected,
wherein the second connection metal and the peripheral transparent electrically-conductive layer are electrically connected,
wherein the peripheral transparent electrically-conductive layer and the first electrode of the storage capacitor are electrically connected, and
wherein the peripheral drive circuit provides a potential to the first electrode of the storage capacitor.

2. The thin film transistor array substrate according to claim 1, wherein the first electrode of the storage capacitor is formed by a same material as the transparent electrically-conductive layer of the light shielding electrode.

3. The thin film transistor array substrate according to claim 2, further comprises:
a first insulation layer on the light shielding electrode and the first electrode of the storage capacitor;
an active layer on the first insulation layer and the light shielding electrode;
a second insulation layer on the active layer; and a source electrode and a drain electrode on the second insulation layer and electrically connected with the active layer each through a via traversing the second insulation layer.

4. The thin film transistor array substrate according to claim 3, wherein the second electrode of the storage capacitor is disposed in a same layer and of a same material as the source electrode and the drain electrode.

5. The thin film transistor array substrate according to claim 3, wherein the second electrode of the storage capacitor is disposed in a same layer and of a same material as the active layer.

6. The thin film transistor array substrate according to claim 3, wherein the thin film transistor further comprises a top gate disposed above the channel.

7. The thin film transistor array substrate according to claim 6, wherein the second electrode of the storage capacitor is disposed in a same layer and of a same material as the top gate.

8. The thin film transistor array substrate according to claim 3, wherein the light shielding electrode is a bottom gate of the thin film transistor.

9. The thin film transistor array substrate according to claim 3, the active layer is electrically connected with the source electrode and the drain electrode through the vias in the second insulating layer and a conductive etching stopper layer.

10. A display panel, comprising the thin film transistor array substrate according to claim 1.

* * * * *